US008203904B2

(12) United States Patent
Jang et al.

(10) Patent No.: US 8,203,904 B2
(45) Date of Patent: *Jun. 19, 2012

(54) SEMICONDUCTOR MEMORY DEVICE AND LAYOUT STRUCTURE OF SUB-WORD LINE CONTROL SIGNAL GENERATOR

(75) Inventors: Dong-Su Jang, Gyeonggi-do (KR); In-Chul Jeong, Gyeonggi-do (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/962,951

(22) Filed: Dec. 8, 2010

(65) Prior Publication Data

US 2011/0075505 A1 Mar. 31, 2011

Related U.S. Application Data

(63) Continuation of application No. 12/177,716, filed on Jul. 22, 2008, now Pat. No. 7,852,703.

(30) Foreign Application Priority Data

Aug. 3, 2007 (KR) .......................... 10-2007-0077956

(51) Int. Cl.
*G11C 8/00* (2006.01)

(52) U.S. Cl. .......... 365/230.06; 365/230.08; 365/230.03

(58) Field of Classification Search ............. 365/230.06, 365/230.08, 230.03
See application file for complete search history.

(56) References Cited

U.S. PATENT DOCUMENTS

| 6,747,908 | B2 * | 6/2004 | Lee et al. ................. 365/230.03 |
| 7,852,703 | B2 * | 12/2010 | Jang et al. ................ 365/230.06 |
| 2006/0171242 | A1 | 8/2006 | Yoon et al. |
| 2006/0209616 | A1 * | 9/2006 | Kim et al. ................. 365/230.06 |

FOREIGN PATENT DOCUMENTS

| JP | 11-354744 | 12/1999 |
| KR | 2006-0082499 | 7/2006 |

* cited by examiner

*Primary Examiner* — Huan Hoang
(74) *Attorney, Agent, or Firm* — Stanzione & Kim, LLP

(57) ABSTRACT

A semiconductor memory device and a layout structure of sub-word line control signal generators. The sub-word line control signal generators are configured to supply a sub-word line control signal of a predefined voltage level to a sub-word line driver to enable a sub-word line of a memory cell array. At least two sub-word line control signal generators are disposed, respectively, at edge areas of the memory cell array, to directly supply the sub-word line control signal to one selected sub-word line driver, thereby reducing the power consumption, including for example, VPP voltage. Embodiments of the present invention also reduce the number of VPP power lines, thereby lessening a noise disturbance.

17 Claims, 5 Drawing Sheets

SEMICONDUCTOR MEMORY DEVICE AND LAYOUT STRUCTURE OF SUB-WORD LINE CONTROL SIGNAL GENERATOR

CROSS-REFERENCE TO RELATED APPLICATIONS

This application is a Continuation Application of U.S. patent application Ser. No. 12/177,716, filed on Jul. 22, 2008 now U.S. Pat. No. 7,852,703, in the U.S. Patent and Trademark Office, which claims priority under 35 U.S.C. §119 (a) from Korean Patent Application 10-2007-0077956, filed on Aug. 3, 2007, in the Korean Intellectual Property Office, the disclosure of which is incorporated herein in its entirety by reference.

BACKGROUND

1. Technical Field

The present invention relates to semiconductor memory devices, and more particularly, to a semiconductor memory device and a layout structure of a sub-word line control signal generator, capable of reducing power consumption and noise and improving an enable speed of the sub-word line by providing a relatively differential layout of the sub-word line control signal and a sub-word line control signal supply line.

2. Description

In general, as a DRAM (Dynamic Random Access Memory) becomes relatively highly integrated and larger in capacity, a time required to transfer a signal increases as compared with a delay time of a memory cell array itself due to a resistance problem of wire. As a result, a length of the wire needs to be appropriately divided to optimize a delay time. For example, a word line to select a row in the memory cell array is appropriately divided to optimize the delay time.

A word line is coupled to a gate terminal of an access transistor constituting a memory cell, and is generally formed of polysilicon. Specific resistance of polysilicon may be high. Moreover a capacitance may be high since the word line passes an upper part of gate oxide of a cell transistor. In other words, when a resistance of the word line becomes great, an RC delay increases and a decoder output terminal driving the word line should be large. Thus, an area size increases and much power is consumed in charging the entire word line to a high voltage, and then discharging it. Therefore, the length of the word line needs to be optimized to reduce resistance.

One approach to solve this problem has been to use a hierarchical divided word line structure to drive a sub-word line. The structure can include dividing a word line into sub-word lines of proper length and combining a main word line of a row decoder and sub-word lines of a sub-word line driver.

In the hierarchical word line structure, a word line is divided into proper lengths and is provided as sub-word lines SWL, and the sub-word lines SWL are driven by a row decoder and a sub-word line driver SWD. The row decoder may be classified as a main word line driver MWD and a sub-word line control signal generator (hereinafter, referred to as 'PXI generator').

The SWD is controlled by a main word line signal NWE output from the MWD and a sub-word line control signal PXI output from the PXI generator.

FIG. 1 illustrates a layout related to a word line selection in a semiconductor memory device according to a conventional art. As shown in FIG. 1, a plurality of memory blocks MBi, MBj and MBk are disposed in a horizontal second direction.

Each of the memory blocks MBi, MBj and MBk comprise a plurality of sub-memory blocks SMB arrayed in a vertical first direction.

In a row decoder area, PXI generators PG13 and PG02 are configured to generate a sub-word line control signal PXI<0-3>. An MWD is configured adjacent to the PXI generators PG13 and PG02. Further, a sub-word line control driver (PXI driver) PD for amplifying sub-word line control signal PXI<0-3> generated in the PXI generators PG13 and PG02, and supplying the signal to the sub-word line driver SWD, is disposed on a conjunction area of a memory core region. The sub-word line control drivers PD use a high voltage of VPP level as a power source voltage, and drive output signals as a high voltage (VPP) level.

The SWD is disposed in an area between two sub-memory cell blocks SMB in a vertical direction. The SWD drives a sub-word line (not shown) in response to a main word line signal NWE generated in the MWD and output signals PXID of the sub-word line control driver PD.

The sub-word line control signal PXI and the output signals PXID of the sub-word line control driver PD have the same voltage level, and the output signals PXID of the sub-word line control driver PD are signals amplified from the sub-word line control signal PXI, thus all of them are commonly called herein a sub-word line control signal PXI.

Operation to drive a sub-word line is described as follows. A row address RA to select a desired sub-word line is applied. For example, when the row address RA is 14 bits, a portion RA13-2 of row address is input to the MWD, i.e., reference number 10, and the rest of the row address RA1-0 is input to the PXI generators PG13 and PG02. The main word line driver 10 generates a block selection signal BS into the PXI generators PG13 and PG02, to activate or select a PXI generator, i.e., reference numbers 12 and 14, corresponding to a specific memory block, i.e., MBj.

The PXI generators 12 and 14 generate the sub-word line control signal PXI into any one of plural, i.e., four, sub-word line control signal supply lines, in response to the row address RA1-0. For example, the PXI generator 12 generates a first sub-word line control signal PXI1. The first sub-word line control signal PXI1 is amplified by the sub-word line control driver 30 and supplied to a sub-word line driver 40. The sub-word line driver 40 enables one sub-word line in response to the first sub-word line control signal PXI1 and main word line signal NEW supplied through a main word line MWL from the main word line driver 10. The main word line signal NWE may have a row enable state. The enable state of the sub-word line may be accomplished by performing a switching operation to supply the first sub-word line control signal PXI1 to a selected sub-word line.

In a conventional semiconductor memory device having the structure described above, respective ones of sub-word line control drivers PD are alternately disposed every two sub-array memory blocks SMB. Further, output lines of the sub-word line control drivers PD, that is, supply lines of sub-word line control signals PXI<1,3> and PXI<0,2>, are disposed as a T-shape in horizontal and vertical directions. Thus, the line length of sub-word line control signals PXI<1,3> and PXI<0,2> is relatively long and a load thereof is relatively large. Thus, VPP power consumption through the sub-word line control drivers PD may be great, and a drive speed for the sub-word line may be relatively slow.

Furthermore, it is the structure that one sub-word line control signal PXI is supplied even to a non-selected memory block, i.e., MBi, thus a VPP power consumption is great. And, as the sub-word line control driver PD is disposed at a conjunction area of a memory core region, a plurality of VPP power lines to supply a VPP power source to the sub-word line control drivers PD must be used. The VPP power lines may be disposed overlapping in an upper part of memory block or disposed in a core region. The VPP power lines acts as a noise source in a semiconductor memory device, thus causing a noise disturbance.

Accordingly, some embodiments of the invention provide a semiconductor memory device and a layout structure of a PXI generator. Power consumption and noise can be reduced. In addition, an enable speed of a sub-word line can be improved. Furthermore, a VPP voltage consumption can decrease, while maintaining high integration.

According to an embodiment of the invention, a layout structure of sub-word line control signal (PXI) generator may be configured to supply a sub-word line control signal of a predefined voltage level to a sub-word line driver to enable a sub-word line of a memory cell array may be characterized in that at least two sub-word line control signal generators are disposed, respectively, at edge areas of an area of the memory cell array, and configured to directly supply the sub-word line control signal to one selected sub-word line driver.

The sub-word line control signal may be directly supplied from the PXI generator to the sub-word line driver without a specific driver, amplifier, or repeater. The memory cell array may comprise a plurality of memory blocks, each memory block having an area including a plurality of sub-memory blocks arrayed in a first direction, the plurality of memory blocks being arrayed in a second direction intersected to the first direction, and wherein the sub-word line driver may be disposed at core regions between the sub-memory blocks.

A supply line of the sub-word line control signal may be disposed overlapping on one memory block area in the first direction, the first direction being a length-wise direction, to supply the sub-word line control signal to at least one sub-word line driver adapted within the one memory block area. The predefined voltage level may be a VPP voltage level higher than an array voltage supplied to the memory cell array.

The PXI generator may generate the sub-word line control signal in response to a given address signal. The sub-word line control signal supply line may be disposed so as to simultaneously supply the sub-word line control signal from the at least two sub-word line control signal generators to sub-word line drivers included in at least two memory blocks.

According to another embodiment of the invention, a semiconductor memory device comprises a plurality of memory blocks, each memory block having an area including a plurality of sub-memory blocks arrayed in a first direction, the plurality of memory blocks being arrayed in a second direction intersected to the first direction; a plurality of sub-word line control signal generators, of which at least two correspond to one sub-word line of a sub-memory block, and are disposed, respectively, at edge areas of a memory block, the plurality of sub-word line control signal generators configured to generate a sub-word line control signal; a plurality of sub-word line drivers configured to supply a signal having the same level as the sub-word line control signal to the one sub-word line, the plurality of sub-word line drivers being disposed in a core region between the sub-memory blocks; and control signal supply lines for directly supplying the sub-word line control signal to the plurality of sub-word line drivers without using a repeater, the sub-word line control signal being generated using the sub-word line control signal generators, the sub-word line control signal having a predefined voltage level.

Each of the PXI generators may have a structure to generate a sub-word line control signal of a predefined voltage level in response to a given address signal and to supply the sub-word line control signal to at least one sub-word line driver of one memory block selected without being supplied to other memory blocks.

Supply lines corresponding to one sub-word line control signal among the control signal supply lines may comprise a first supply line disposed in a first direction as a length direction and a second supply line disposed in a second direction as a width direction. The first supply line may be coupled between the at least two sub-word line control signal generators that are disposed at both edge areas of the memory block in the first direction, and the second supply line may be disposed to couple at least one corresponding sub-word line driver with the first supply line. The first supply line may be disposed overlapping on the memory block area.

The PXI generator may generate the sub-word line control signal in response to the given address and a block selection signal to select a memory block. The sub-word line control signal may be supplied to sub-array blocks adapted within at least two adjacent memory blocks.

According to another embodiment of the invention, a layout structure of PXI generator may be configured to supply a sub-word line control signal to a sub-word line driver to enable a sub-word line of a memory cell array may be characterized in that the PXI generator corresponds to one sub-word line driver, the sub-word line control signal generator being divided into a main generator and a sub-generator for simultaneously supplying the sub-word line control signal to one supply line, the main generator and the sub-generator being disposed, respectively, at edge areas of the memory cell array.

The main generator may be disposed at a row decoder area about an edge area of the memory cell array, and the sub-generator may be disposed at an area opposite to a layout area of the main generator. The memory cell array may comprise a plurality of memory blocks arrayed in a second direction intersected to a first direction, each memory block including a plurality of sub-memory blocks arrayed in the first direction, the sub-word line driver being disposed in core regions within an area of each memory block.

The supply line may be disposed overlapping the memory block in the first direction, the first direction being a length-wise direction.

According to some embodiment of the invention, power consumption can be reduced including that of VPP voltage, and the number of VPP power lines can be reduced, thereby decreasing noise. In addition, a memory core region can be utilized, thereby obtaining a high integration. Furthermore, a word line can be enabled without a speed decrease even without adapting a sub-word line control driver.

BRIEF DESCRIPTION OF THE DRAWINGS

The present invention will become more fully understood from the detailed description given herein below, and the accompanying drawings, which are given by way of illustration only, and thus are not limitative of the present invention, wherein.

DETAILED DESCRIPTION OF THE EMBODIMENTS

Embodiments of the present invention now will be described more fully hereinafter with reference to FIGS. 2 to 5, in which example embodiments of the invention are shown. This invention may, however, be embodied in many different forms and should not be construed as limited to the embodiments set forth herein. Rather these embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 5. This invention may, however, be embodied in many different forms and should not be construed as being limited to the exemplary embodiments set forth herein; rather, these exemplary embodiments are provided so that this disclosure is thorough and complete, and conveys the concept of the invention to those skilled in the art.

Figure 1:
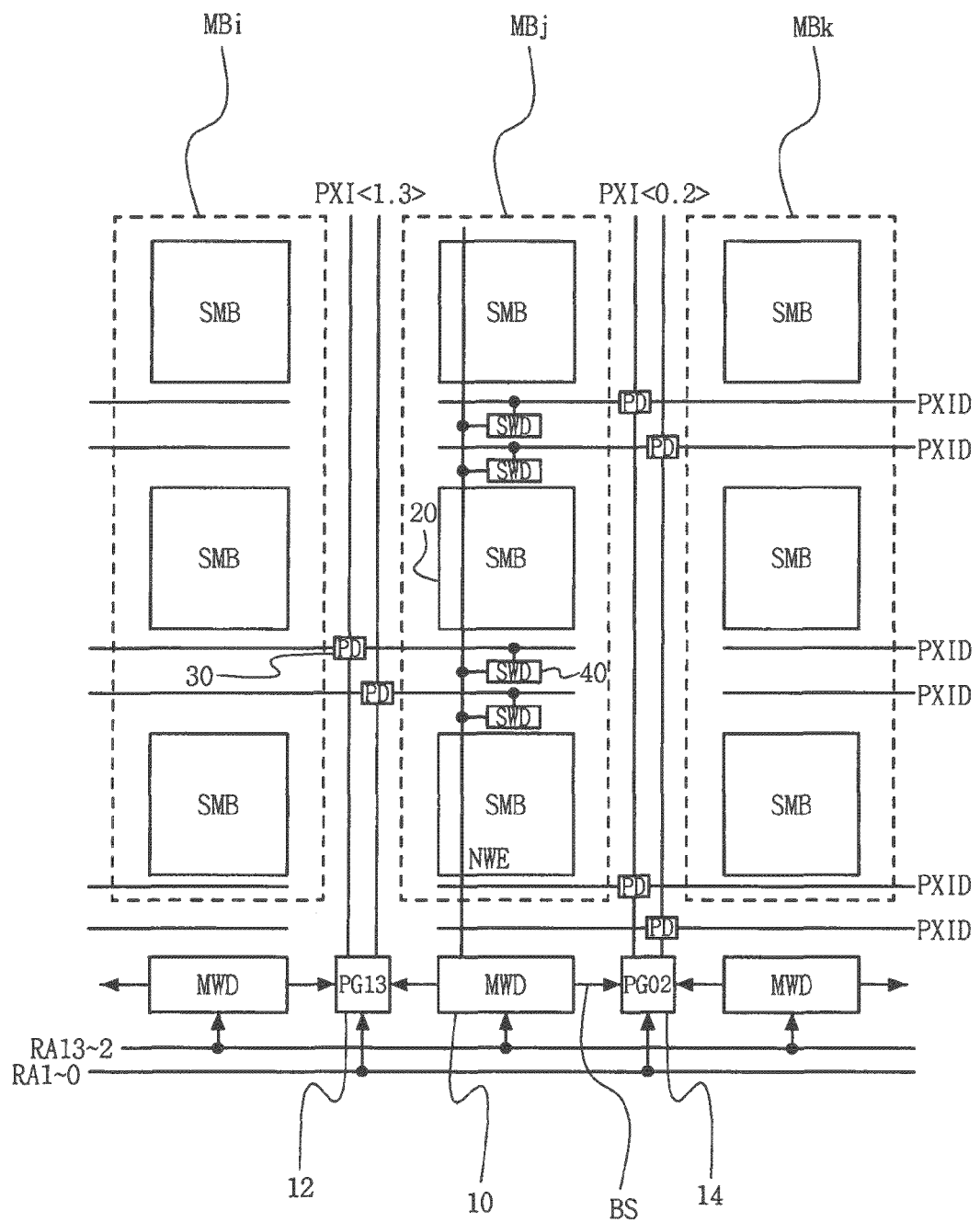
FIG. 1 illustrates a layout related to a word line selection in a semiconductor memory device according to a conventional art.
Figure 2:
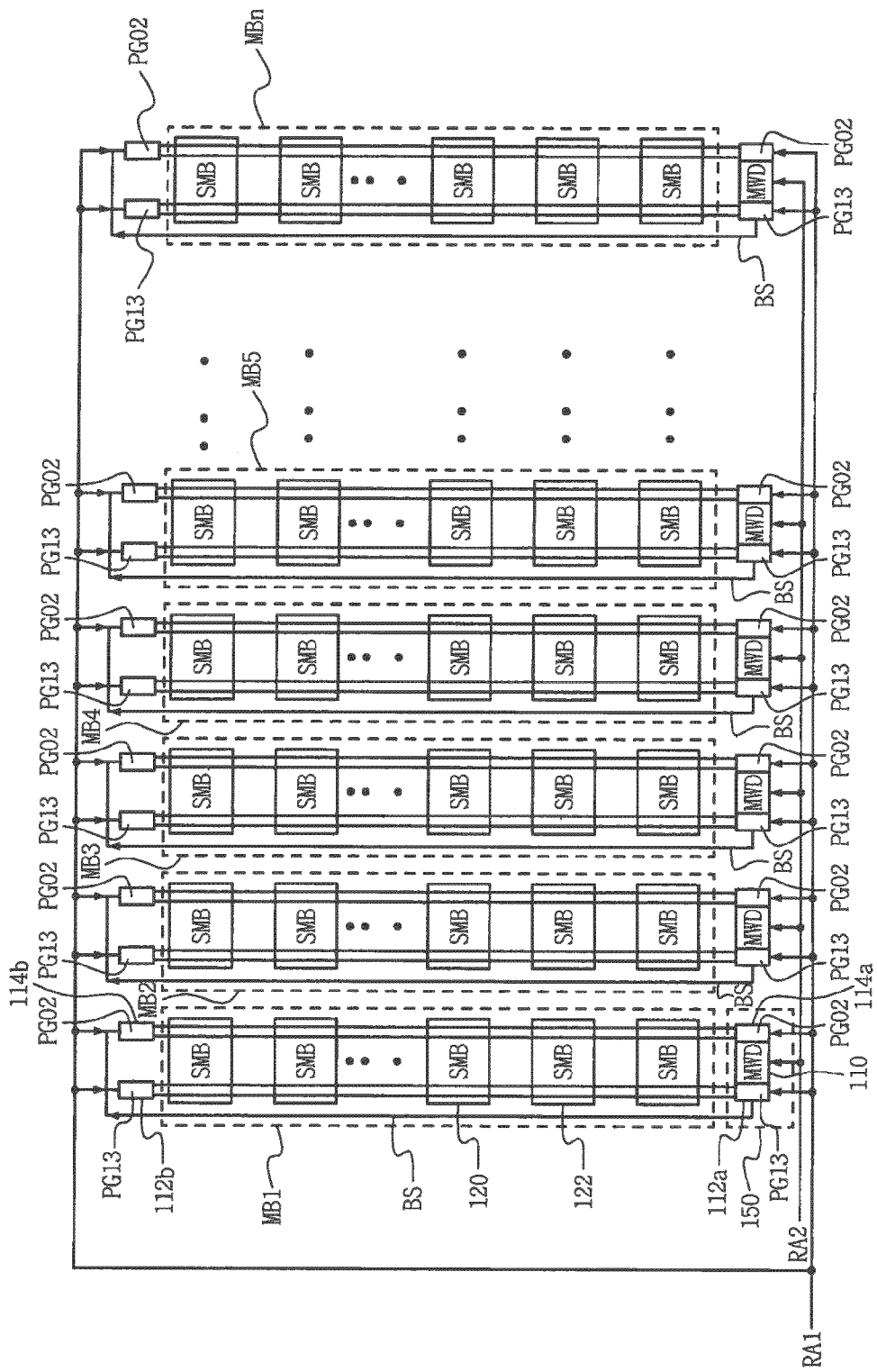
FIG. 2 illustrates a layout structure of semiconductor memory device according to an embodiment of the invention.
Figure 3:
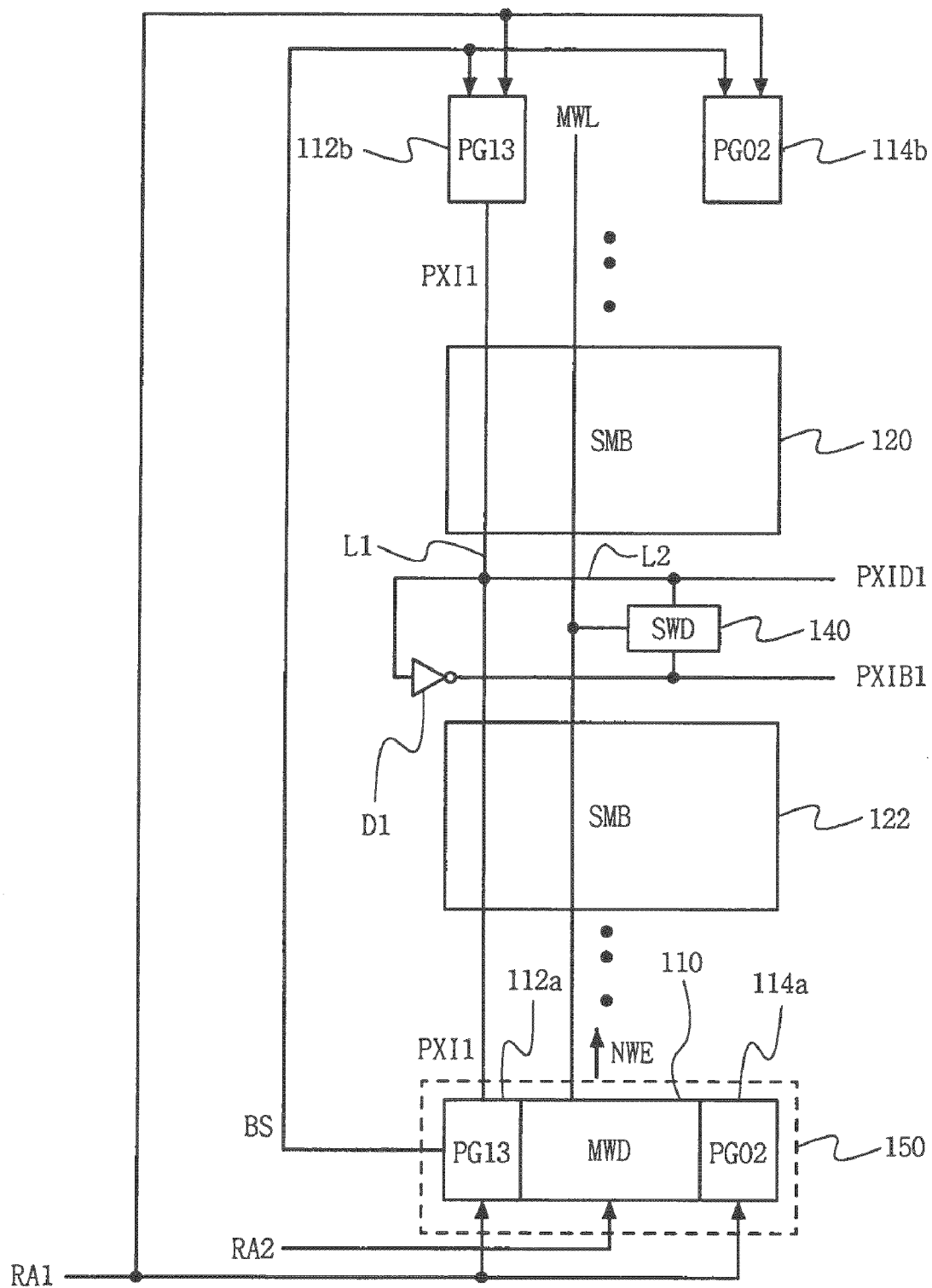
FIG. 3 illustrates a partially enlarged view of FIG. 2.

FIG. 2 illustrates a layout structure of semiconductor memory device according to an embodiment of the invention. FIG. 3 illustrates a partially enlarged view of FIG. 2. FIG. 3 illustrates an enlarged portion of area of first memory block MB1 shown in FIG. 2.

Referring to FIGS. 2 and 3, a semiconductor memory device according to an embodiment of the invention comprises a plurality of memory blocks MB1-MBn, a plurality of PXI generators PG13 and PG02, a plurality of sub-word line drivers SWD, and control signal supply lines L1 and L2.

The plurality of memory blocks MB1-MBn each comprises a plurality of sub-memory blocks SMB arrayed in a first direction, and are arrayed in a second direction intersected to the first direction. That is, in the structure, the plurality of sub-memory blocks SMB are regularly arrayed, sub-memory blocks SMB arrayed in the first direction are defined as one memory block, i.e., MB1, and the memory blocks may have a structure of being disposed in plural numbers in the second direction. The plurality of memory blocks MB1-MBn may constitute a memory cell array of the semiconductor memory device. That is, the plurality of memory blocks MB1-MBn may be disposed in a memory cell array area.

The PXI generators PG13 and PG02 are adapted in plural numbers so that at least two respective generators correspond to one sub-word line SWL of the sub-memory block SMB. The at least two PXI generators corresponding to the one sub-word line may be disposed, respectively, at both edge areas of the memory blocks MB1-MBn arranged in a first direction.

The PXI generator PG13 may generate a first sub-word line control signal PXI1 and a third sub-word line control signal PXI3. The PXI generator PG02 may generate a zeroth sub-word line control signal PXI0 and a second sub-word line control signal PXI2. The sub-word line control signal PXI may have four signals. Two PXI generators, i.e., two PG13 or two PG02, may be disposed to generate one sub-word line control signal PXI.

For example, as shown in FIG. 3, at least two PXI generators 112a and 112b are adapted to supply a sub-word line control signal PXI1 to one sub-word line driver 140. The PXI generators 112a and 112b are disposed at both edge areas of the memory block MB 1. The PXI generators 112a and 112b operate in response to a given row address RAI.

The plurality of sub-word line drivers SWD supply a signal having the same level as the sub-word line control signal PXI in response to the sub-word line control signal PXI to a corresponding sub-word line. The sub-word line drivers SWD may be disposed in a core region between sub-memory blocks SMB adjacent in a first direction. For example, one sub-word line driver 140 may be disposed on a core region between sub-array memory blocks 120 and 122 adjacent mutually in the first direction. Operation and structure of the sub-word line driver SWD are described below with reference to FIG. 4.

Control signal supply lines L1 and L2 may supply the sub-word line control signal that is generated in the PXI generators PG13 and PG02 and that has a predefined voltage level, i.e., VPP voltage level, directly to the sub-word line driver SWD without a specific driver, amplifier, or repeater. The control signal supply lines L1 and L2 are classified as a first supply line L1 and a second supply line L2. The first supply line L1 is disposed in the first direction as a length direction to connect respective PXI generators PG13 or PG02 adapted in both edge areas of memory block MBi. The second supply line L2 is disposed in a second direction to supply a signal of the first supply line L1 to the sub-word line driver SWD.

As shown in FIG. 3, the first supply line L1 is disposed to connect between at least two PXI generators P112a and 112b adapted at both edge areas of the memory block in the first direction. The second supply line L2 is disposed to connect at least one or more corresponding sub-word line drivers 140 with the first supply line L1. The second supply line may be coupled to sub-word line driver 140 configured about one memory block MB 1. In other words, it may be coupled to only sub-word line driver 140 of a selected memory block MB1. In this case, the first supply line L1 may have a structure of being not disposed in a core region, but rather disposed overlapping on the memory block area.

According to an embodiment of the invention, and unlike the conventional art, a specific sub-word line control driver, amplifier, or repeater, etc., to supply sub-word line control signal PXI to sub-word line driver SWD, is not used. As a result, a high integration can be obtained by saving a layout space that would otherwise be needed for the sub-word line control driver, amplifier, or repeater. Furthermore, a noise reduction can be obtained by omitting a layout of a power line of a predefined voltage level to drive the specific sub-word line control driver, amplifier, or repeater, thereby saving the layout space that would otherwise be needed for the power line.

Referring to an enlarged view of FIG. 3, representing a core region of sub-memory blocks 120 and 122 within first memory block MB 1, a layout area may include PXI generators 112a and 112b disposed at edge areas of first memory block MB1, and control signal supply lines Li and L2 referred to in FIG. 2. The layout structure is described in more detail as follows. FIG. 3 illustrates only one sub-word line driver 140 between specific memory blocks 120 and 122 among a plurality of sub-word line drivers SWD, and only a sub-word line control signal PXI1 corresponding to the sub-word line driver 140 and corresponding control signal supply lines L1 and L2. The layout structure of FIG. 3 may be equally applied to other memory blocks MB2-MB*n*.

As shown in FIG. 3, PXI generators 112*a* and 112*b* may be disposed at both edge areas of first memory block MB 1. The PXI generator 112*b* disposed at an upper edge area of the memory block MB 1 is called herein a sub-generator, and the PXI generator 112*a* disposed at a row decoder area 150 as a lower edge area of the memory block MB 1 is called herein a main generator.

The main generator 112*a* and the sub-generator 112*b* have substantially the same structure and operation, and generate sub-word line control signal PXI1 in response to a given row address RA1 and block selection signal BS. For such operation, a supply line may be disposed to supply the block selection signal BS to the sub-generator 112*b*, and a supply line may be disposed to supply a given row address RA1.

At the row decoder area 150, at the lower edge area of the memory block MB1, the main generator 112*a* may be disposed adjacent a main word line driver 110. The main word line driver 110 may provide main word line signal NWE to the sub-word line driver 140. The main word line signal NWE may be supplied through main word line MWL. The main word line driver 110 provides the block selection signal BS to the main generator 112*a* and the sub-generator 112*b*.

The first supply line L I may be disposed with the first direction as a length direction to connect between the main generator 112*a* and the sub-generator 112*b*. The first supply line L1 is disposed at a core region according to a conventional art, but herein is disposed overlapping on an upper area of the memory block MB1 according to an embodiment of the invention. Accordingly, a utilized extent of the core region can increase.

The second supply line L2 may be disposed in the second direction as a width direction to supply sub-word line control signal PXI1 of the first supply line L1 to the sub-word line driver 140. Unlike the conventional art, the second supply line L2 is disposed to supply the control signal to only the sub-word line driver 140 adapted within one memory block MB 1. Unlike the conventional 'T'-shaped structure, the second supply line L2 has the layout structure of being connected to only the sub-word line driver 140 of one memory block MB1. That is, the structure is to supply the sub-word line control signal PXI1 generated in the sub-generator 112*b* and the main generator 112*a* to only the sub-word line driver 140 of one memory block MB1, but not to supply it to sub-word line driver SWD of another memory block. Consequently, a length of second supply line is reduced, thereby lessening a load and a power consumption, such as a VPP charge consumption, etc.

Sub-word line control signal PXID1 provided through the second supply line L2 is called 'PXID 1' herein to discriminate from the sub-word line control signal PXI1 supplied through the first supply line L 1. Additionally, a floating prevention signal PXIB 1 to prevent a sub-word line coupled to the sub-word line driver 140 from floating may be supplied through a driver DI, inverting the sub-word line control signal PXI1.

Figure 4:
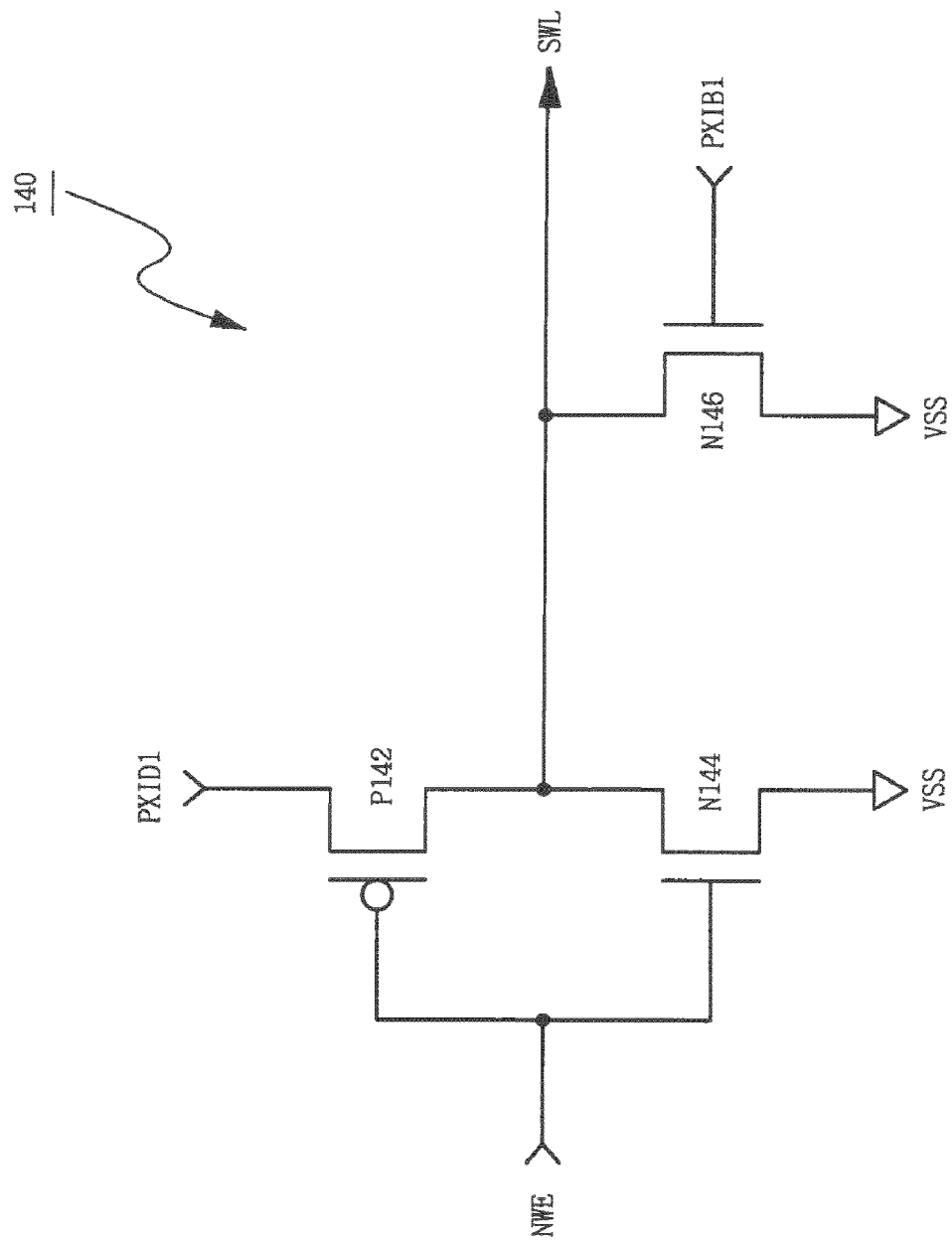
FIG. 4 is a circuit diagram illustrating an embodiment of the sub-word line driver shown in FIG. 3.

FIG. 4 is a circuit diagram illustrating an embodiment of the sub-word line driver 140 shown in FIG. 3. As shown in FIG. 4, the sub-word line driver 140 comprises a PMOS transistor P142 and NMOS transistors N144 and N146. The sub-word line driver 140 drives sub-word line SWL in response to the main word line signal NWE input through main word line MWL, sub-word line control signal PXID1, and the floating prevention signal PXIB1, as a complementation sub-word line control signal. The circuit of FIG. 4 is an example of a sub-word line driver SWD and persons having skill in the art will recognize that it may be configured in various other ways.

Referring to FIGS. 3 and 4, an operation to drive a sub-word line is described as follows. First, a row address RA is applied to select a required sub-word line. The row address RA may be 14 bits. A portion RA2 of the row address may be applied to the main word line driver MWD, i.e., 110, and the rest of the row address RA1 may be applied to the main generator 112*a* and the sub-generator 112*b*. The main word line driver 110 generates and transmits block selection signal BS to the main generator 112*a* and the sub-generator 112*b*, thereby activating or selecting the main generator 112*a* and sub-generator 112*b* corresponding to the first memory block MB 1. The block selection signal BS is assumed herein as a signal to select the first memory block MB1.

The main generator 112*a* and the sub-generator 112*b* may simultaneously transmit signals into the first supply line LI among a plurality, i.e., four, of sub-word line control signals PXIO-PXI3, in response to the row address RA1 and the block selection signal BS. The first sub-word line control signal PXI1 is supplied to the sub-word line driver 140 through the second supply line L2 connected to the first supply line L1 without passing through a specific driver, amplifier, or repeater.

The sub-word line driver 140 may enable one sub-word line SWL in response to the sub-word line control signal PXIDI and the main word line signal NWE supplied through the main word line MWL from the main word line driver 110.

Figure 5:
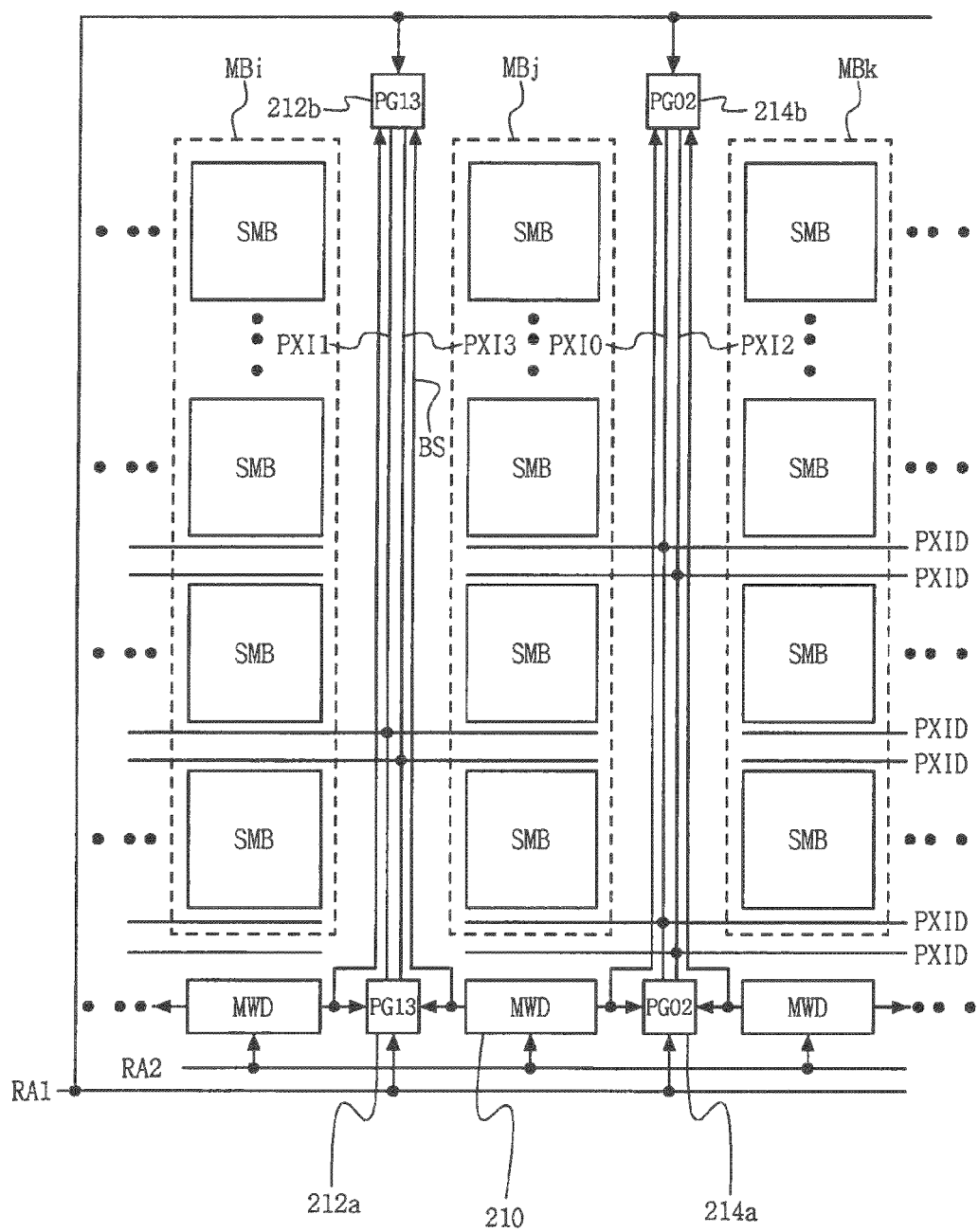
FIG. 5 illustrates a layout structure of a semiconductor memory device according to another embodiment of the invention.

FIG. 5 illustrates a layout structure of a semiconductor memory device according to another embodiment of the invention. As shown in FIG. 5, a semiconductor memory device according to an embodiment of the invention has a structure different from the layout structure described referring to FIGS. 2 and 3.

Unlike the description referred to in FIGS. 2 and 3, in FIG. 5 one main generator, i.e., 212*a*, and one sub-generator, i.e., 212*b*, have a layout structure to supply a signal to the sub-word line driver adapted within at least two memory blocks. That is, the structure is provided herein so that one sub-word line control signal PXI is supplied simultaneously to at least two memory blocks, i.e., MBi and MBj. In supplying the sub-word line control signal PXI, a specific repeater, amplifier, or driver is not used.

In FIGS. 2 and 3, respective one main generator and sub-generator are adapted for one memory block. On the other hand, FIG. 5 has the layout structure that two memory blocks, i.e., MBi and MBj share each one main generator 212*a* and sub-generator 212*b*. Supply lines to supply sub-word line control signal PXI1 and PXI3 may be disposed in a core region between the memory blocks MBi and MBj with the first direction as a length direction. Lines to supply block selection signal BS may be disposed near the supply lines. Further, a layout of main word line driver 210 may be the same as FIGS. 2 and 3, and a layout structure of memory blocks MBi, MBj and MBk and sub-memory blocks SMB may be the same as FIG. 2.

As described above, according to some embodiments of the invention, there is provided a structure to simultaneously generate a sub-word line control signal corresponding to one sub-word line or one sub-word line driver by using a main generator and a sub-generator that are disposed at both edge areas of a memory block. In addition, the layout structure is provided to directly supply a sub-word line control signal generated in the main generator and sub-generator to a sub-word line driver without a specific repeater or driver.

According to some embodiments of the invention, power consumption can be reduced including the VPP voltage, and the number of VPP power lines can be reduced, thereby decreasing noise. In addition, a memory core region can be utilized, thereby obtaining a high integration. Furthermore, a word line can be enabled without a decrease of speed, and without a sub-word line control driver.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. Accordingly, these and other changes and modifications are seen to be within the true spirit and scope of the invention as defined by the appended claims.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A layout structure of a sub-word line control signal generator configured to supply a sub-word line control signal to a sub-word line driver to enable a sub-word line of a memory cell array, the structure comprising:
   at least two sub-word line control signal generators disposed, respectively, at edge areas of an area of the memory cell array, and configured to directly supply the sub-word line control signal via a signal line to one selected sub-word line driver, the at least two sub-word line control signal generators supplying an equal sub-word line control signal to the selected sub-word line driver,
   wherein the equal sub-word line control signal is directly connected via the signal line to the at least two sub-word line control signal generators,
   wherein the at least two sub-word line control signal generators further comprise a main generator and a sub-generator.

2. The structure of claim 1, wherein the at least two sub-word line control signal generators generate the equal sub-word line control signal in response to a row address signal and block selection signal inputted to the at least two sub-word line control signal generators.

3. The structure of claim 2, further comprising a main word line driver to receive a first portion of the row address signal and to generate and transmit a block selection signal to the at least two sub-word line control signal generators.

4. The structure of claim 3, wherein a second portion of the row address signal is applied to the at least two sub-word line control signal generators.

5. The structure of claim 3, wherein the main word line driver provides a main word line signal to the sub-word line driver.

6. The structure of claim 1, further comprising a main word line driver adjacent the main generator and not adjacent the sub-generator.

7. The structure of claim 1, further comprising a plurality of control signal supply lines to supply the equal sub-word line control signal generated in the at least two sub-word line control generators to at least one sub-word line driver of one memory block selected without being supplied to other memory blocks.

8. The structure of claim 7, wherein the control signal supply lines comprise a first supply line disposed in a first direction, and a second supply line disposed in a second direction intersecting the first direction.

9. The structure of claim 8, wherein the first supply line is coupled between the at least two sub-word line control signal generators that are disposed at both edge areas of the memory block in the first direction, and the second supply line is disposed to couple at least one corresponding sub-word line driver with the first supply line.

10. The structure of claim 1, wherein the at least two sub-word line control signal generators are connected to the one selected sub-word line driver and generate the equal sub-word line control signal to be supplied to the one selected sub-word line driver.

11. The structure of claim 1, wherein the edge areas are disposed on opposing sides of the memory cell array.

12. The structure of claim 1, further comprising:
   a junction point between the at least two sub-word line generators within the memory cell array such that the sub-word line signal is connected via a first control signal control line to the at least two sub-word line generators to the junction and the junction is connected to the sub-word line driver via a second control signal control line.

13. A semiconductor memory device comprising:
   a plurality of memory blocks, each memory block having an area including a plurality of sub-memory blocks arrayed in a first direction, the plurality of memory blocks being arrayed in a second direction that intersects the first direction;
   a plurality of sub-word line control signal generators configured to supply a sub-word line control signal, wherein at least two of the plurality of sub-word line control signal generators correspond to one sub-word line of a sub-memory block, the at least two generators being disposed, respectively, at edge areas of a memory block and generating an equal sub-word line control signal;
   a plurality of sub-word line drivers configured to supply a signal having the same level as the sub-word line control signal, the plurality of sub-word line drivers being disposed in a core region between the sub-memory blocks; and
   control signal supply lines for directly supplying the sub-word line control signal to the plurality of sub-word line drivers without using a repeater, the sub-word line control signal being generated using the sub-word line control signal generators,
   wherein the equal sub-word line control signal is directly connected via signal lines to the at least two sub-word line control signal generators.

14. A layout structure of a sub-word line control signal generator configured to supply a sub-word line control signal to a sub-word line driver to enable a sub-word line of a memory cell array, the structure characterized in that the sub-word line control signal generator corresponds to one sub-word line driver, the sub-word line control signal generator being divided into a main generator and a sub-generator for simultaneously supplying the sub-word line control signal to at least one supply line, the main generator and the sub-generator being disposed, respectively, at edge areas of the memory cell array and the main generator and the sub-generator generating an equal sub-word line control signal,
   wherein the equal sub-word line control signal is directly connected via a signal line to the at least two sub-word line control signal generators.

15. A layout structure of a sub-word line control signal generator configured to supply a sub-word line control signal to a sub-word line driver to enable a sub-word line of a memory cell array, the structure comprising:
- at least two sub-word line control signal generators disposed at opposite edge areas of an area of the memory cell array, and configured to directly supply a same sub-word line control signal to one selected sub-word line driver; and
- a main word line driver adjacent at least one sub-word line control signal generator disposed at one edge area of the memory cell array.

16. The structure of claim 15, wherein the same sub word line control signal is directly connected via a signal line to the at least two sub word line control signal generators.

17. The structure of claim 15, wherein the main word line driver generates a block selection signal in response to a row address signal to control the at least two sub-word line control signal generators to generate the same sub-word control line signal.

* * * * *